(12) United States Patent
Werking

(10) Patent No.: US 9,112,462 B2
(45) Date of Patent: Aug. 18, 2015

(54) VARIABLE-GAIN DUAL-OUTPUT TRANSCONDUCTANCE AMPLIFIER-BASED INSTRUMENTATION AMPLIFIERS

(71) Applicant: Honeywell International Inc., Morristown, NJ (US)

(72) Inventor: Paul M Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 92 days.

(21) Appl. No.: 13/895,268

(22) Filed: May 15, 2013

(65) Prior Publication Data

US 2014/0340146 A1    Nov. 20, 2014

(51) Int. Cl.

| | |
|---|---|
| H03F 1/36 | (2006.01) |
| H03G 3/00 | (2006.01) |
| H03F 1/32 | (2006.01) |
| H03F 3/45 | (2006.01) |
| H03G 1/00 | (2006.01) |

(52) U.S. Cl.
CPC ............... *H03G 3/00* (2013.01); *H03F 1/3211* (2013.01); *H03F 3/45475* (2013.01); *H03G 1/0035* (2013.01); *H03G 1/0088* (2013.01); *H03F 2200/261* (2013.01); *H03F 2203/45138* (2013.01); *H03F 2203/45522* (2013.01); *H03F 2203/45528* (2013.01)

(58) Field of Classification Search
CPC .......... H03F 3/45475; H03F 2200/261; H03F 2203/45138; H03F 2203/45528; H03F 3/45183; H03F 1/26; H03F 2200/372; H03F 2203/45356; H03F 2203/45496; H03F 2203/45512; H03F 2203/45514; H03F 2203/45526; H03F 2003/45008; H03F 2200/405; H03F 2203/45511; H03F 2203/45522; H03F 1/0277; H03F 1/3211; H03F 1/342; H03F 2200/294; H03F 2200/661
USPC .................. 330/69, 86, 252, 253, 260, 282
See application file for complete search history.

(56) References Cited

U.S. PATENT DOCUMENTS

| | | | |
|---|---|---|---|
| 4,030,043 | A | 6/1977 | Hamilton |
| 5,093,634 | A | 3/1992 | Khoury |
| 5,138,278 | A | 8/1992 | Stessen |
| 5,410,274 | A | 4/1995 | Birdsall et al. |

(Continued)

FOREIGN PATENT DOCUMENTS

KR      20030053492 A      6/2003

OTHER PUBLICATIONS

Grigorescu, "Amplifiers Built with Current-Conveyors," Romania Journal Physics., vol. 53, pp. 109-1133, 2008.

(Continued)

*Primary Examiner* — Khanh V Nguyen
(74) *Attorney, Agent, or Firm* — Shumaker & Sieffert, P.A.

(57) ABSTRACT

A variable-gain current conveyor-based instrumentation amplifier without introducing distortion. An exemplary variable-gain instrumentation amplifier includes a first dual-output transconductance amplifier (DOTA) (i.e., current conveyor) that receives a first input voltage, a second DOTA that receives a second input voltage, a first resistive element connected between the first and second DOTA, an amplifier connected to the second DOTA at an inverting input, and a second resistive element that connects the second DOTA and the inverting input to an output of the amplifier. At least one of the resistive elements is a variable resistive element.

14 Claims, 7 Drawing Sheets

(56) References Cited

U.S. PATENT DOCUMENTS

| | | | |
|---|---|---|---|
| 5,483,194 | A | 1/1996 | Genest |
| 5,933,054 | A | 8/1999 | Kimura |
| 5,936,466 | A | 8/1999 | Andoh et al. |
| 6,084,461 | A | 7/2000 | Colbeth et al. |
| 6,107,856 | A | 8/2000 | Bitting |
| 6,538,503 | B2 | 3/2003 | Burt |
| 6,538,513 | B2 | 3/2003 | Godfrey et al. |
| 6,583,671 | B2 | 6/2003 | Chatwin |
| 6,710,655 | B2 | 3/2004 | Parkhurst et al. |
| 7,068,107 | B2 | 6/2006 | Wang |
| 7,193,466 | B2 | 3/2007 | Kim et al. |
| 7,215,197 | B2 | 5/2007 | Regier |
| 7,301,398 | B1 | 11/2007 | Allott et al. |
| 7,327,189 | B2 | 2/2008 | Regier |
| 7,479,831 | B2 | 1/2009 | Malone |
| 7,557,651 | B2 | 7/2009 | Corsi |
| 7,671,686 | B2 | 3/2010 | Kuo et al. |
| 7,847,633 | B2 | 12/2010 | Kinget |
| 7,893,759 | B1 | 2/2011 | Werking |
| 8,035,422 | B2 | 10/2011 | Wei |
| 8,049,562 | B2 | 11/2011 | Kumar et al. |
| 8,081,030 | B2 | 12/2011 | Werking |
| 8,723,604 | B2 * | 5/2014 | Wan .............................. 330/292 |
| 2002/0101285 | A1 | 8/2002 | Chatwin |
| 2003/0169104 | A1 * | 9/2003 | Huckins et al. ................. 330/69 |
| 2003/0201791 | A1 | 10/2003 | Andrys et al. |
| 2004/0125678 | A1 | 7/2004 | Sinha et al. |
| 2006/0038614 | A1 | 2/2006 | Regier |
| 2007/0057721 | A1 | 3/2007 | Risbo et al. |
| 2010/0013537 | A1 | 1/2010 | Eminoglu et al. |
| 2010/0156385 | A1 | 6/2010 | Werking |
| 2011/0121902 | A1 | 5/2011 | Wurcer et al. |

OTHER PUBLICATIONS

"Precision Variable Gain Amplifiers," Tutorial MT-072 by Analog Devices, Inc., 2009, 10 pp.

Al-Hashimi, et al., "Intergrated Universal Biquad Based on Triple-Output OTA's and Using Digitally Programmable Zeros," accessed from, http://ieeexplore.ieee.org/xpls/abs_all.jsp?arnumber=694947, downloaded on Dec. 19, 2011, 1 pp.

Kimura, "The Ultra-Multi-Tanh Technique for Bipolar Linear Transconductane Amplifiers," downloadable from http://ieeexplore.ieee.org/xpls/abs_all.jsp?arnumber=563619, downloaded on Dec. 19, 2011, 3 pp.

Al-Hashimi, "Current Mode Filter Structure Based on Dual Output Transconductance Amplifiers," accessed from http://ieeexplore.ieee.org/xpls/abs_all.jsp?arnumber=490706, downloaded on Dec. 19, 2011, 1 pp.

Tadic et al., "Optical Receiver with Widely Tunable Sensitivity in BiCMOS Technology," IEEE Transactions on Circuits and Systems—I; Regular Papers, vol. 55, No. 5, Jun. 2008, 14 pp.

Babaei et al., "High CMRR and Low THD Current-Mode Instrumentation Amplifier Using Current Inversion Technique," Norchip, IEEE, 2007, 4 pp.

Ghallab et al., "A Novel Current-Mode Instrumentation Amplifier Based on Operational Floating Current Conveyor," IEEE Transactions on Instrumentation and Measurement, vol. 54, No. 5, Oct. 2005, 10 pp.

Gift, "An Enhanced Current-Mode Instrumentation Amplifier," IEEE Transactions on Instrumentation and Measurement, vol. 5, No. 1, Feb. 2001, 4 pp.

Toumazou, et al. "Novel Current-Mode Instrumentation Amplifier," Electronics Letters, Feb. 2, 1989, vol. 25, No. 3, 3 pp.

Wilson, "Universal Conveyor Instrumentation Amplifier," Electronic Letters, Mar. 30, 1989, vol. 25, No. 7, 2 pp.

Jaikla, et al., "A Versatile Quadrature Oscillator and Universal Biquad Filter Using Dual-Output Current Controlled Current Differencing Transconductance Amplifier," IEEE, 2006, 4 pp.

Soliman, "Three port gyrator circuits using transconductance amplifiers or generalized conveyors," International Journal of Electronics and Communications, Jul. 18, 2011, 8 pp.

U.S. Appl. No. 13/553,503, by Paul M. Werking, filed Jul. 19, 2012.

Search Report from counterpart European Application No. 14166279.1, dated Jun. 18, 2014, 5 pp.

Koli et al., "CMRR Enhancement Techniques for Current-Mode Instrumentation Amplifiers," IEEE Transactions on Circuits and Systems-I: Fundamental Theory and Applications, vol. 47(5), May 2000, 11 pp.

Tang, "Enhanced Programmable Instrumentation Amplifier," IEEE Sensors, Oct. 31, 2005, 4 pp.

Examination Report from counterpart European Application No. 14166279.1, dated Jul. 3, 2014, 5 pp.

Response to Examination Report dated Jul. 3, 2014, from Counterpart European Patent Application No. 14166279.1, dated Nov. 18, 2014, 12 pp.

* cited by examiner

VARIABLE-GAIN DUAL-OUTPUT TRANSCONDUCTANCE AMPLIFIER-BASED INSTRUMENTATION AMPLIFIERS

BACKGROUND OF THE INVENTION

CMOS transmission gate (T-gate) switches introduce distortion when used in an instrumentation amplifier (IA). A prior-art transmission gate circuit is shown in FIG. 1. Transistors MN1 and MP1 form the CMOS switch between pins "IN" and "OUT". This switch is controlled by the "PGATE" and "NGATE" voltages, which are driven out of phase and rail to rail (0-5V) by two digital inverters.

The off-resistance of this switch is essentially infinite (>1000 meg). The on-resistance is typically between 50 and 5000 ohms, depending on design, and varies with process, supply voltage, and temperature (PVT). Furthermore, the on-resistance also varies with the voltage present at the "IN" and "OUT" terminals. The magnitude of this non-linear variation in resistance is typically significant, on the order of +/−10% of the nominal on-resistance over the full range of applied voltages in a given system. In amplifier circuits where low signal distortion is important, the effects of this non-linear on-resistance must always be mitigated.

SUMMARY OF THE INVENTION

The present invention provides a variable-gain current conveyor-based instrumentation amplifier without introducing transmission gate distortion.

An exemplary variable-gain instrumentation amplifier includes a first current conveyor that receives a first input voltage, a second current conveyor that receives a second input voltage, a first resistive element connected between the first and second current conveyors, an amplifier connected to the second current conveyor at an inverting input, and a second resistive element that connects the second current conveyor and the inverting input to an output of the amplifier. At least one of the resistive elements is a variable resistive element.

In one aspect of the invention, the current conveyors are dual-output trans conductance amplifiers (DOTAs).

BRIEF DESCRIPTION OF THE DRAWINGS

Preferred and alternative embodiments of the present invention are described in detail below with reference to the following drawings:

FIGS. 5-1 through 5-3, and 6 through 8 show exemplary current-conveyor instrumentation amplifier circuits formed in accordance with various embodiments of the present invention.

DETAILED DESCRIPTION OF THE INVENTION

Figure 2:
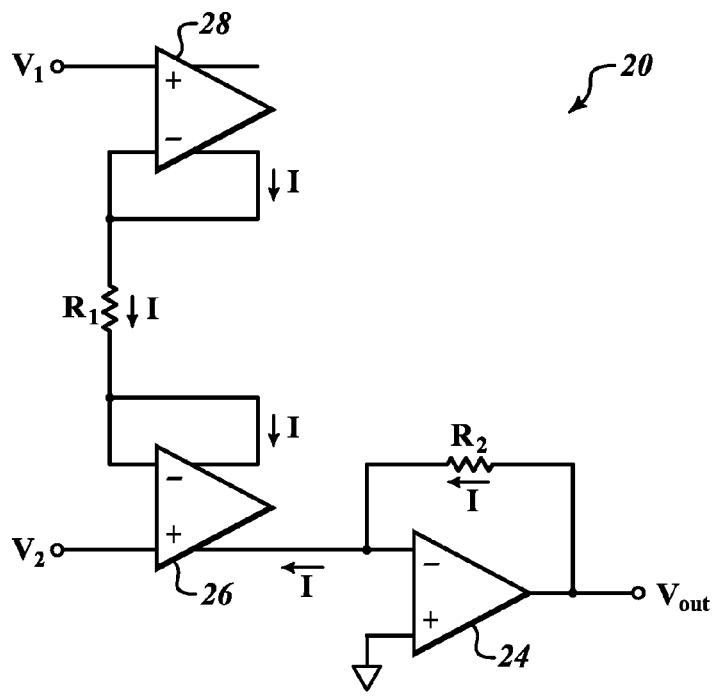
FIGS. 2 through 4 are conceptual circuits used to show some of the theory behind the present invention.

FIG. 2 illustrates an instrumentation amplifier (IA) 20. For clarity, dual-output transconductance amplifier (DOTA) symbols 26, 28 are used to represent current conveyors. One of ordinary skill would understand how to apply current conveyors to the IA 20. The gain of the IA 20 is defined by the following equation:

$$A_V = V_{OUT}/(V_1-V_2) = R_2/R_1 \quad (1)$$

Figure 3:
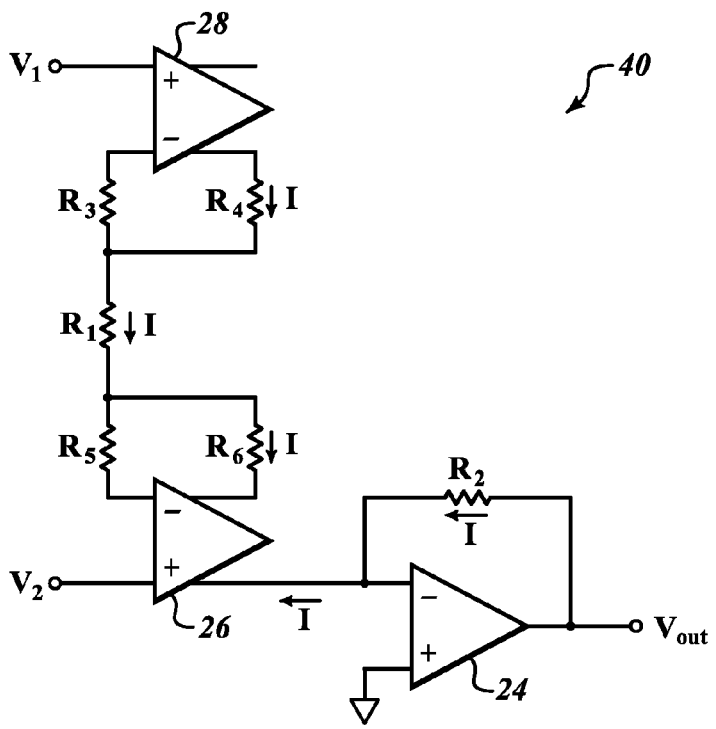

As shown in FIG. 3, a IA 40 includes an additional resistor, $R_3$, between resistor $R_1$ and the DOTA 26. The voltage gain remains the same, $A_v = R_2/R_1$, because there is no significant current flowing through the resistor $R_3$, especially when using CMOS amplifiers, and no voltage is developed across the resistor $R_3$.

Also in the IA 40, a resistor $R_4$ is added between the resistor $R_1$ and the DOTA 26. The gain remains the same for small values of the resistor $R_4$. In this case, the same current that flows through the resistor $R_1$ also flows through the resistor $R_4$ but the voltage that develops across the resistor $R_4$ does not affect overall gain until the DOTA 26 saturates. For positive input voltages ($V_1-V_2>0$), this happens when the sum of the voltages across the resistors $R_4$ and $R_1$ is greater than the voltage across the resistor $R_2$. Because the same current, I, flows through all three resistors, this is equivalent to saying that the sum of the resistors $R_4$ and $R_1$ must be less than the value of resistor $R_2$ to avoid amplifier saturation. In other words:

$$R_4+R_1<R_2, \quad (2)$$

where it is assumed that all amplifiers are connected to the same power supply voltages, all amplifiers have the same saturation characteristics, and one of the inputs is at the ground potential (either $V_1=0$ or $V_2=0$, the worst case). This is equivalent to the condition:

$$R_4<R_2-R_1 \quad (3)$$

Because $A_v=R_2/R_1$, equation (3) is equivalent to equation (4) by substitution.

$$R_4<R_1(A_v-1) \quad (4)$$

In most practical systems, the desired voltage gain is greater than unity and reasonable values of the resistor $R_4$ will not have any effect on the gain of the IA circuit 40. In the same way, resistor $R_5$ does not affect IA voltage gain and small values of resistor $R_6$ ($R_6<R_2-R_1$) do not affect gain, either.

Figure 4:
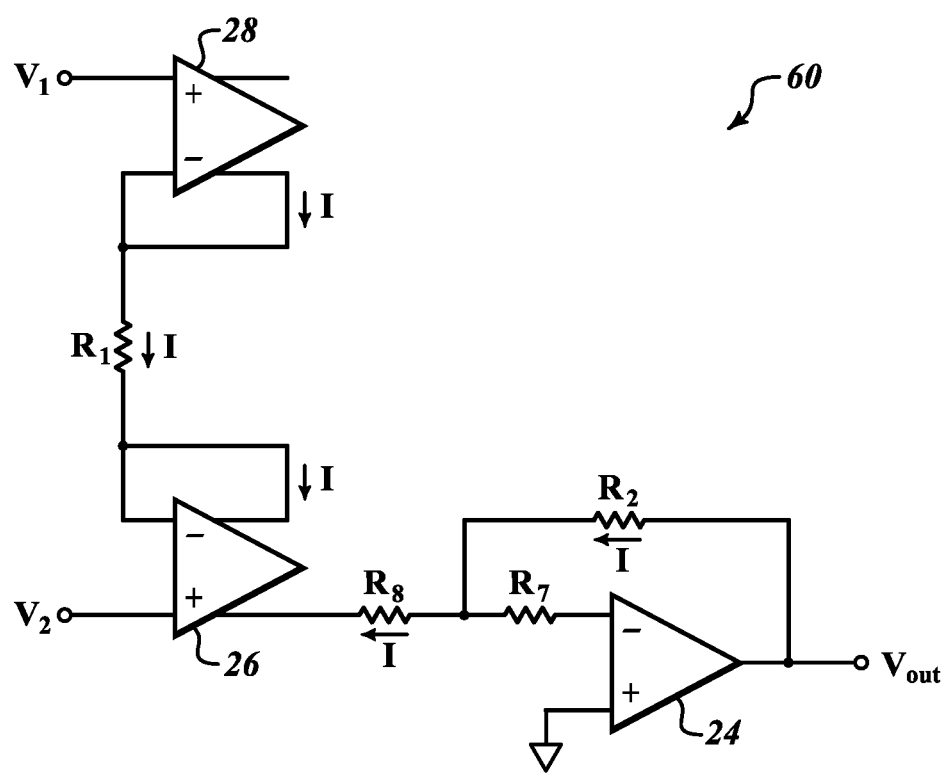

In a similar manner, FIG. 4 is a IA 60 that includes vestigial resistors $R_7$ and $R_8$ that are added to the negative input of the amplifier 24 without affecting the voltage gain of the IA 60 ($A_v=R_2/R_1$). In the IA 60, reasonable values of the resistor $R_7$ do not affect the gain because there is no current flowing through the resistor $R_7$ and the voltage across the resistor $R_7$ is insignificant (zero for CMOS amplifiers). However, if the value of the resistor $R_7$ is very large, it may affect high-frequency AC performance.

The gain of the IA 60 is also not affected by the value of the resistor $R_6$, even though there is current flowing through the resistor $R_8$, as long as the value is small enough to prevent saturation of the DOTA 26 output. Given the assumption that both amplifiers 26 and 24 are connected to the same power supply, have the same saturation characteristics, and that the node common to the resistors $R_2$, $R_7$, and $R_8$ is at zero volts (a virtual ground), then this condition is met when the voltage across the resistor $R_8$ is less than or equal to the voltage across the resistor $R_2$. Because the same current, I, flows through both the resistors $R_2$ and $R_8$, the gain of the IA 60 will not be affected by the value of the resistor $R_8$, as long as the value of the resistor $R_8$ is less than or equal to the value of the resistor $R_2$.

$$R_8 \leq R_2 \quad (5)$$

Figure 1:
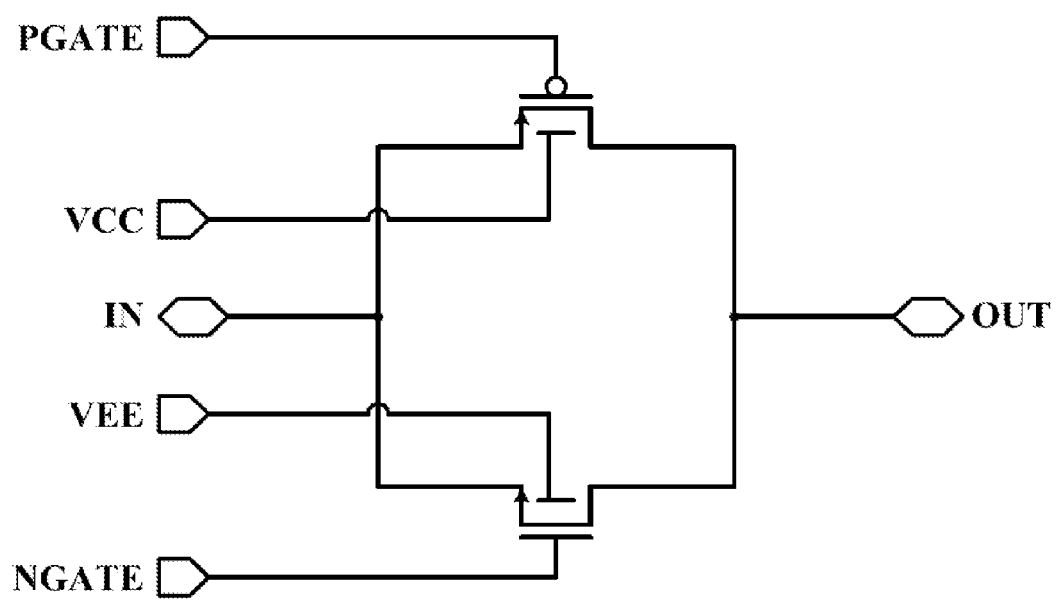
FIG. 1 is a transmission gate circuit formed in accordance with the prior art.
Figures 1, 5:
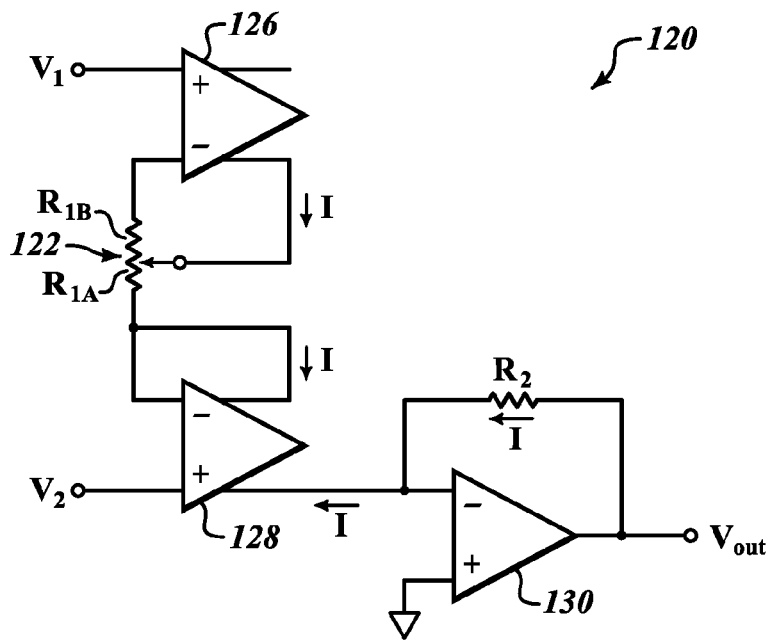
Figures 2, 5:
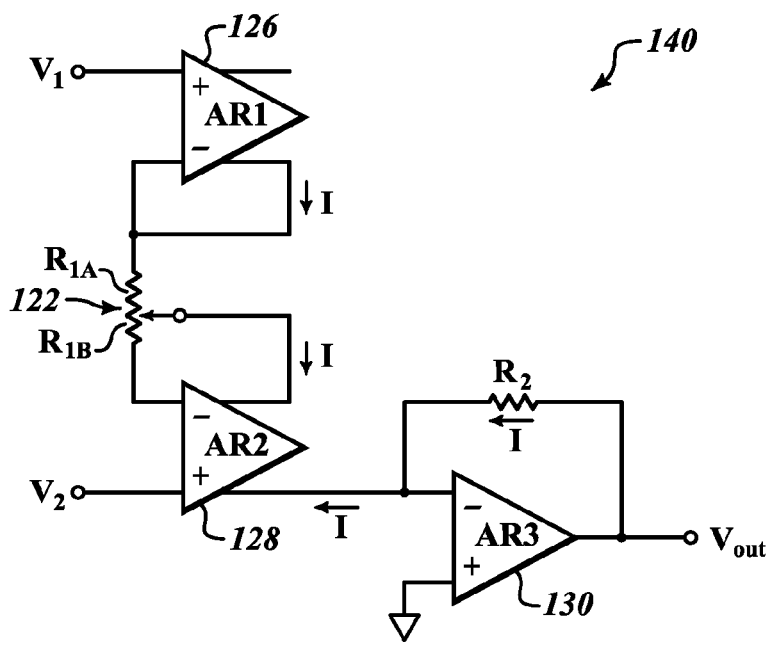
Figures 3, 5:
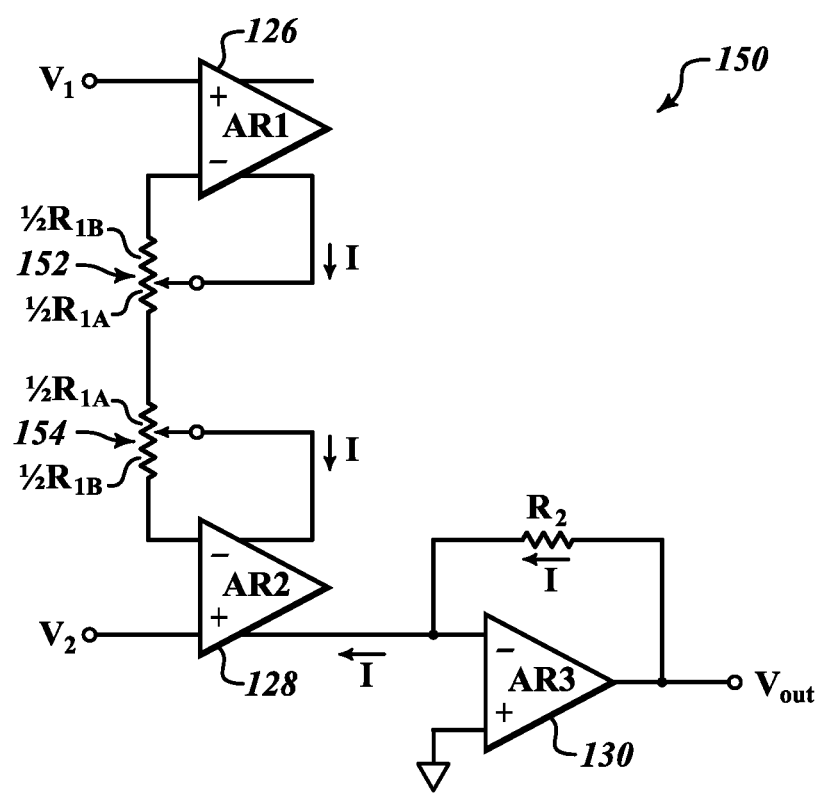

In one embodiment, as shown in FIG. 5-1, the gain of IA 120 is changed using a three-terminal potentiometer 124. A potentiometer 122 is positioned between two DOTAs 126, 128 that receive two different input voltages ($V_1$, $V_2$). The output of the second DOTA 128 is connected to the inverting input of a noninverting amplifier 30. Functionally, all three circuits from FIGS. 5-1 through 5-3 have the following gain. Current conveyors are shown in U.S. Pat. Nos. 8,081,030 and 7,893,759, which are hereby incorporated by reference.

$$A_v = R_2/R_{1A} \quad (6)$$

The potentiometer 122 is modeled as a pair of resistors ($R_{1A}+R_{1B}$) such that the sum of the pair is a constant resistance ($R_1=R_{1A}+R_{1B}$). When the wiper of the potentiometer 122 is at one extreme, the resistance between the wiper and the current-carrying end of the potentiometer 122 is a maximum of $R_1$ ($R_{1A}=R_1$ and $R_{1B}=0$). In this position, the gain of the IA 120 is equal to $R_2/R_1$. When the wiper is at the other extreme, where $R_{1A}=0$ and $R_{1B}=R_1$, the gain of the IA is, in theory, $R_2/0$ or infinity. As a practical matter, two effects will prevent the gain from actually going to infinity: (1) the open-loop gain of the input amplifiers and (2) the nonzero wiper contact resistance. Still, very high values of gain, on the order of 1000 or more are feasible.

As shown in FIG. 5-2, an IA 140 is configured similarly to the IA 120, except that the potentiometer 122 receives the wiper from the second DOTA 128.

As shown in FIG. 5-3, a IA 150 includes two potentiometers 152, 154, each having a maximum resistance of one half of the maximum resistance of the potentiometer 122 (FIGS. 5-1, 5-2). The IA 150 has the advantage that the values of the noncurrent-carrying resistor segments ½$R_{1B}$ may be matched if the two potentiometers 152, 154 are ganged together. In this case, whatever secondary effect these resistor segments have on the high-frequency AC response of the input amplifiers (i.e., DOTAs 126, 128) is equalized and the overall effect on bandwidth is minimized.

Figure 6:
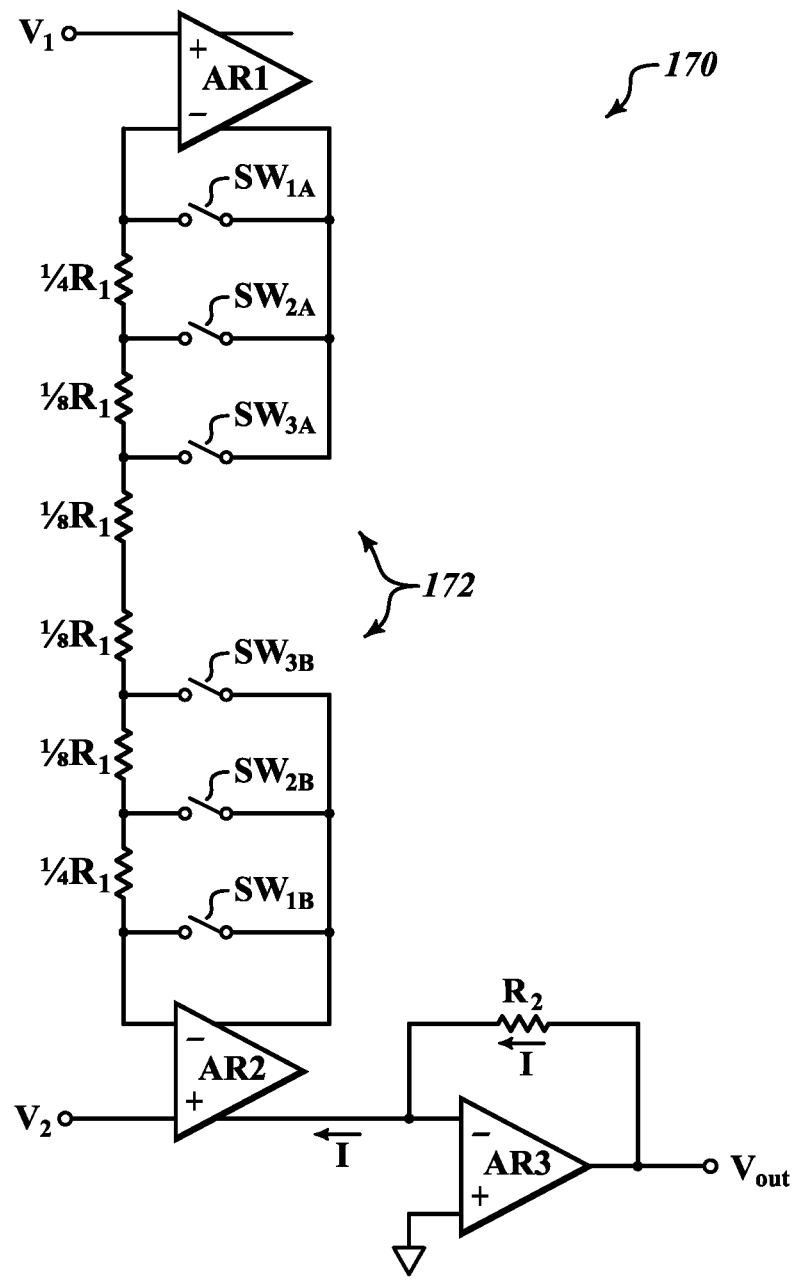

FIG. 6 shows an IA 170 that includes an array 172 of six resistor segments that replace the resistor $R_1$ from the IAs shown in FIGS. 2 through 4. This resistor array 172 is connected to CMOS transmission gates $SW_{1A}$ thru $SW_{3B}$ or some other active switch. The array 172 of resistor segments and digitally controlled T-gates is implemented on an integrated circuit; whereas the potentiometer approach is not. While this approach is not continuous and limits the IA gain to certain discrete steps, arrays of hundreds or thousands of resistor segments are feasible. In one embodiment, a digital logic block controls the CMOS transmission gates. The digital logic block may, in turn, be controlled by a microprocessor and computer program based on user input.

In the IA 170 there are three gain settings. Let $A_1$ denote the first gain setting (only switches $SW_{1A}$, $SW_{1B}$ are on) where $A_1=R_2/R_i$. Then, the second gain setting, with only the switches $SW_{2A}$, $SW_{2B}$ conducting, is $A_2=R_2/R_1/2=2$ $A_1$. In a similar manner, the third gain setting, with only the switches $SW_{3A}$, $SW_{3B}$ on, is $A_3=R_2/R_1/4=4$ $A_1$. To summarize, these three gain settings are related, as shown in Table 1. In one embodiment, the IA 170 does not require an array of equal-value resistor segments.

TABLE 1

| Switch setting | Relative gain |
| --- | --- |
| $SW_{1A}$, $SW_{1B}$ | $A_1$ |
| $SW_{2A}$, $SW_{2B}$ | 2 $A_1$ |
| $SW_{3A}$, $SW_{3B}$ | 4 $A_1$ |

A significant consideration is the on-state resistance of the CMOS transmission gates 172 used as the switches shown in FIG. 6. The on-state resistance is not critical as long as it is less than $R_2-R_{1A}$. This requirement is most difficult to meet (smallest resistance) for the switches $SW_{1A}$, $SW_{1B}$ and becomes progressively easier to meet for the switches $SW_{2A}$, $SW_{2B}$ and then $SW_{3A}$, $SW_{3B}$ which benefit from progressively larger values of gain.

The transmission gates do not cause distortion in the IA 170 as long as the peak on-resistance is less than $R_2-R_1$. Transmission gates are not typically used in gain switching circuits where direct current flows through them because their on-resistance varies with the operating voltage.

Figure 7:
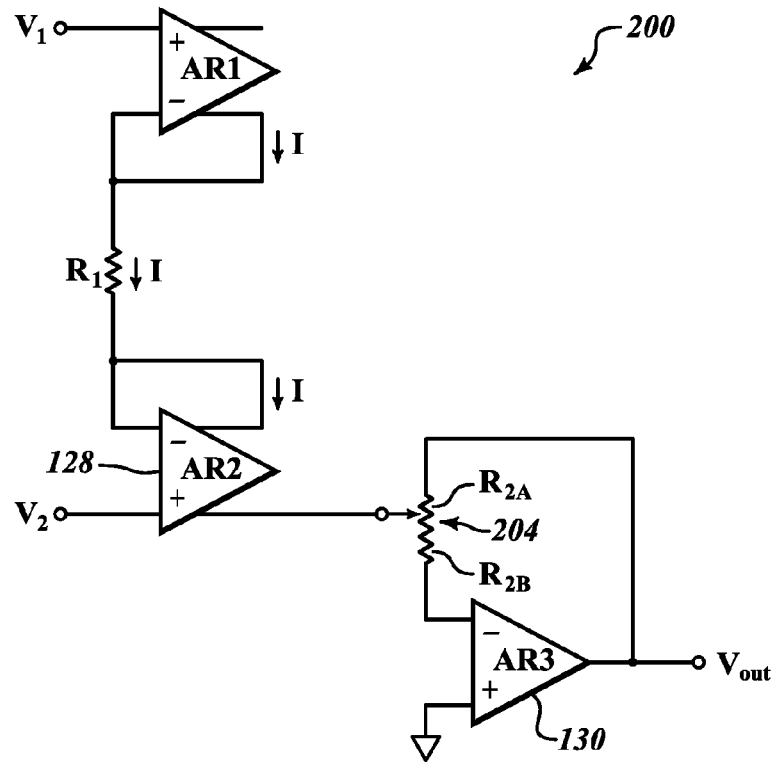

As shown in FIG. 7, an IA 200 includes a common three-terminal potentiometer 204 for changing the gain of the circuit 200. The potentiometer 204 is located between the second DOTA 128 and the amplifier 130. The gain of the IA 200 is given by equation (7) below where a first resistor segment $R_{2A}$ of the potentiometer 204 carries direct current and a second resistor segment $R_{2B}$ does not carry direct current.

$$AV = R_{2A}/R_1 \quad (7)$$

In one embodiment, the potentiometer 204 is set so that the first resistor segment $R_{2A}=0$ and the second resistor segment $R_{2B}=R_2$. Thus, the gain of the IA 200 is zero: $A_v=0/R_1=0$. At the other extreme, the potentiometer 204 is set so that first resistor segment $R_{2A}=R_2$ (see FIG. 2) and the second resistor segment $R_{2B}=0$. Thus, the gain of the IA 200 is the same as the nominal gain using fixed resistors: $A_v=R_2/R_1$. As a practical matter, the gain of the IA 200 cannot go to exactly zero, due to the finite terminal resistance of the potentiometer 204. However, the gain may easily be reduced by three or four orders of magnitude from the nominal gain.

Figure 8:
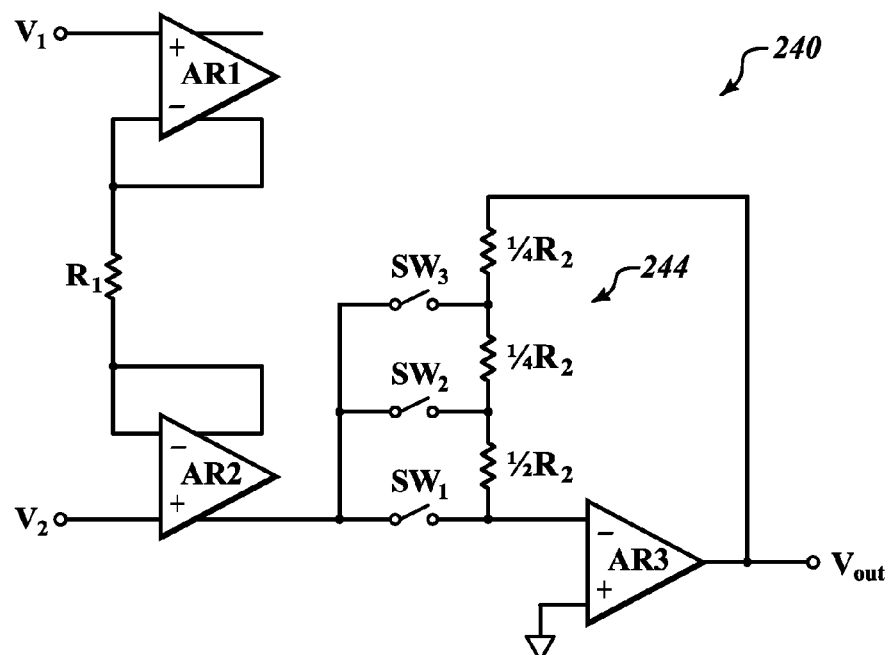

As shown in FIG. 8, an IA 240 includes an array 244 of three resistor segments and transmission gates, or other switches. Three possible gain settings are listed in Table 2 below where the nominal gain, $A_1$, is $R_2/R_1$.

The IA 240 allows:

TABLE 2

| Switch setting | Relative gain |
| --- | --- |
| $SW_3$ | $A_1$ |
| $SW_2$ | ½$A_1$ |
| $SW_1$ | ¼$A_1$ |

In one embodiment, the features shown in FIGS. 5 through 8 may be combined to construct IA circuits whose gains may be varied over a very wide range of values: from zero to infinity with ideal components. Even with real components, the gain may be varied by at least six orders of magnitude. Furthermore, this may be accomplished with a high degree of gain accuracy and no amplifier distortion.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A variable-gain instrumentation amplifier comprising:
   a first dual-output transconductance amplifier (DOTA) configured to receive a first input voltage;
   a second DOTA configured to receive a second input voltage;
   a first resistive element connected between the first and second DOTAs;
   an amplifier comprising an inverting input, the amplifier being connected to the second DOTA output at the inverting input; and a second resistive element configured to connect the second DOTA and the inverting input to an output of the amplifier, wherein at least one of the resistive elements comprises a variable resistive element, wherein the first resistive element comprises two potentiometers.

2. The amplifier of claim 1, wherein the first resistive element comprises:
 a plurality of resistors connected in series between first terminals of the first and second DOTAs;
 at least one first CMOS transmission gate, wherein the at least one first CMOS transmission gate is connected between a first side of one of the resistors and a second terminal of the first DOTA; and
 at least one second CMOS transmission gate, wherein the at least one second CMOS transmission gate is connected between a first side of one of the resistors and a second terminal of the second DOTA.

3. The amplifier of claim 1, wherein the second resistive element comprises a potentiometer.

4. The amplifier of claim 1, wherein the second resistive element comprises:
 a plurality of resistors connected in series between the inverting input and an output of the amplifier; and
 at least one first CMOS transmission gate, wherein the at least one first CMOS transmission gate is connected between a first side of one of the resistors and a terminal of the second DOTA.

5. A method comprising:
 at a first dual-output transconductance amplifiers (DOTAs), receiving a first input voltage;
 at a second DOTA, receiving a second input voltage; and
 at at least one of a first resistive element connected between the first and second DOTAs or a second resistive element connected between the second DOTA, an inverting input of an amplifier and an output of the amplifier, varying gain of the
 amplifier by varying one of the resistive elements,
 wherein the first resistive element comprises two potentiometers.

6. The method of claim 5, wherein the first resistive element comprises:
 a plurality of resistors connected in series between first terminals of the first and second DOTAs;
 at least one first CMOS transmission gate, wherein the at least one first CMOS transmission gate is connected between a first side of one of the resistors and a second terminal of the first DOTA; and
 at least one second CMOS transmission gate connected between a first side of one of the resistors and a second terminal of the second DOTA,
 wherein varying the gain of the amplifier comprises varying the state of the transmission gates.

7. The method of claim 5, wherein the second resistive element comprises a potentiometer.

8. The method of claim 5, wherein the second resistive element comprises:
 a plurality of resistors connected in series between the inverting input and an output of the amplifier; and
 at least one CMOS transmission gate, wherein the at least one CMOS transmission gate is connected between a first side of one of the resistors and a terminal of the second DOTA,
 wherein varying the gain of the amplifier comprises varying the state of the at least one transmission gate.

9. A variable-gain instrumentation amplifier comprising:
 a first dual-output transconductance amplifier (DOTA) configured to receive a first input voltage;
 a second DOTA configured to receive a second input voltage;
 a first resistive element connected between the first and second DOTAs;
 an amplifier comprising an inverting input, the amplifier being connected to an output of the second DOTA at the inverting input; and
 a second resistive element configured to connect the second DOTA and the inverting input to an output of the amplifier,
 wherein at least one of the first and second resistive elements comprises a controllably variable resistive element that enables a gain of the instrumentation amplifier to be controllably varied.

10. The instrumentation amplifier of claim 9, wherein the controllably variable resistive element comprises at least one potentiometer.

11. The instrumentation amplifier of claim 9, wherein the controllably variable resistive element comprises two potentiometers.

12. The instrumentation amplifier of claim 9, wherein at least the first resistive element comprises the controllably variable resistive element, and the controllably variable resistive element comprises:
 a plurality of resistors connected in series between first terminals of the first and second DOTAs; and
 an array of switches connected to the plurality of resistors, wherein the array of switches enables the plurality of resistors to be controllably switched, thereby enabling the controllably variable resistive element to enable the gain of the instrumentation amplifier to be controllably varied.

13. The instrumentation amplifier of claim 12, wherein the switches comprise digitally controlled CMOS transmission gates.

14. The instrumentation amplifier of claim 9, wherein at least the second resistive element comprises the controllably variable resistive element, and the controllably variable resistive element comprises:
 a plurality of resistors connected in series between the inverting input and an output of the amplifier; and
 an array of switches connected to the plurality of resistors, wherein the array of switches enables the plurality of resistors to be controllably switched, thereby enabling the controllably variable resistive element to enable the gain of the instrumentation amplifier to be controllably varied.

* * * * *